Figure 1:
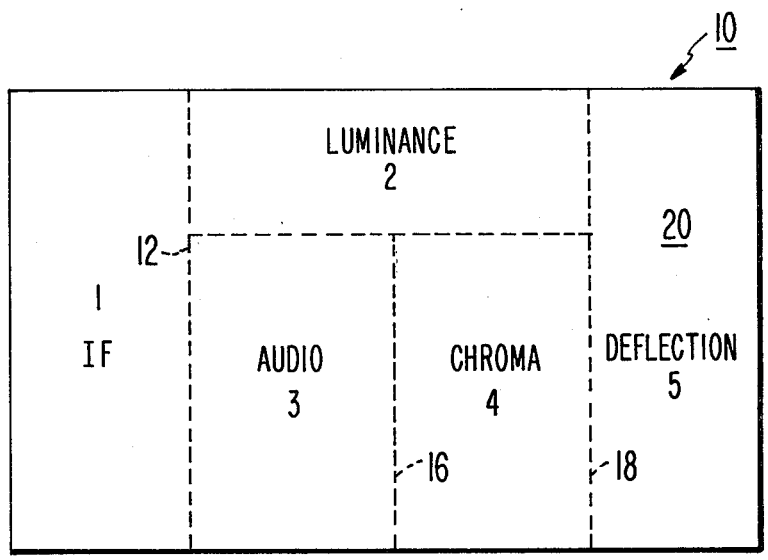

United States Patent [19]

Harford

[11] 4,216,523

[45] Aug. 5, 1980

[54] MODULAR PRINTED CIRCUIT BOARD

[75] Inventor: Jack R. Harford, Flemington, N.J.

[73] Assignee: RCA Corporation, New York, N.Y.

[21] Appl. No.: 856,994

[22] Filed: Dec. 2, 1977

[51] Int. Cl.² ............................................. H05K 1/04
[52] U.S. Cl. .................................. 361/393; 29/402.08;
             29/412; 29/413; 29/414; 361/409; 361/413
[58] Field of Search .............. 361/393, 409, 394, 395,
         361/413, 412; 29/412, 413, 414, 418, 625, 626,
                         574, 401 R, 401 F; 174/68.5; 35/19 A

[56] References Cited

U.S. PATENT DOCUMENTS

| | | | |
|---|---|---|---|
| 2,876,391 | 3/1959 | Sanders | 361/394 |
| 2,947,914 | 8/1960 | Simons | 361/393 |
| 3,096,466 | 7/1963 | Gossard | 29/626 |
| 3,484,341 | 12/1969 | Devitt | 29/625 |
| 3,765,076 | 10/1973 | Brandt | 29/625 |
| 3,780,431 | 12/1973 | Feeney | 174/68.5 |
| 3,895,266 | 7/1975 | Geiger | 361/413 |
| 3,926,746 | 12/1975 | Hargis | 361/414 |
| 3,949,274 | 4/1976 | Anacker | 29/626 |
| 3,984,860 | 10/1976 | Logue | 29/574 |

FOREIGN PATENT DOCUMENTS 739828  11/1955  United Kingdom ............... 339/17 LM Primary Examiner—David Smith, Jr.
Attorney, Agent, or Firm—Samuel Cohen; William Squire

[57] ABSTRACT

A printed circuit board substrate is subdivided into sections, the boundary of each section being defined by notches which weaken the substrate and thereby permit the substrate to be fractured at the boundaries of the sections to permit the removal of a defective section. Printed conductors which electrically connect one section to another pass over the weakened substrate regions and when a section is removed, these conductors fracture at the boundary of the removed section. A replacement section may then be substituted for the removed defective section and its conductors connected to corresponding fractured conductors on the substrate.

8 Claims, 6 Drawing Figures

MODULAR PRINTED CIRCUIT BOARD

The present invention relates to printed circuit boards.

Printed circuit boards are widely used, often in "modular" fashion. A module may consist of a single such board which is designed to perform one or sometimes a number of related electrical functions, and several such modules may be interconnected via connections, cables or other conductors to form a system or a sub-system of an electronic equipment such as a radio receiver, as an example. Failures sometime occur in such a system or sub-system because of high resistance or open connections between modules, sometimes caused by corrosion, sometimes caused by mechanical displacement of parts as a result of repeated connection and disconnection of one module from another, and sometimes caused for other reasons.

A printed circuit board embodying the invention which overcomes the above problems comprises a substrate which is common to all the modules and which therefore does not require the kinds of interconnecting means between modules discussed above. This substrate is formed with notch means at the module boundaries for forming a fracture line which permits the separation of the substrate into sections. Should a module fail, the section comprising that module is separated from the remainder of the substrate at the notch means and replaced with a like section using a suitable connector. Thus, it is only after failure of a component or module on the printed circuit board that a connector is used.

IN THE DRAWING

Figure 2:
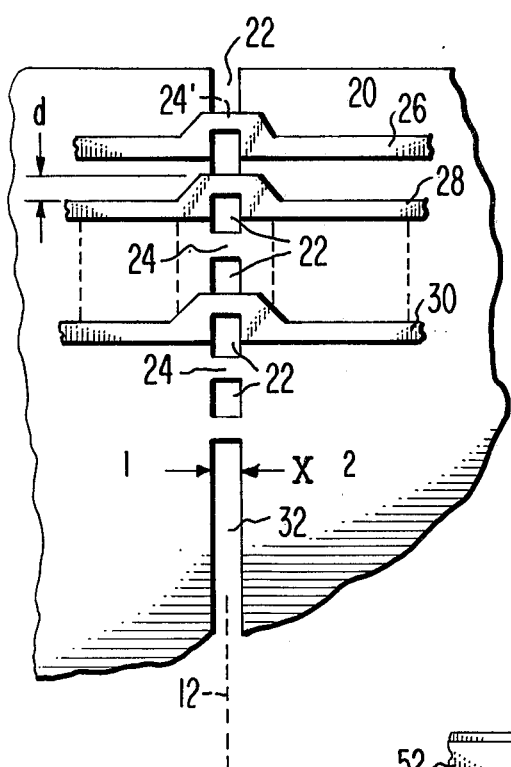
Figure 4:
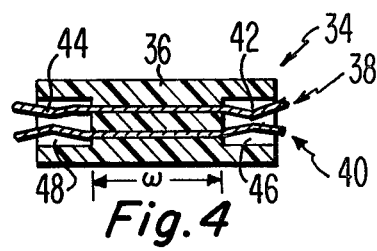
Figure 3:
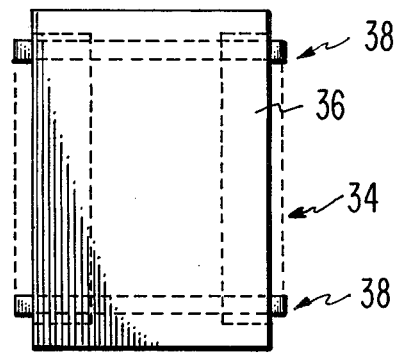
Figure 6:
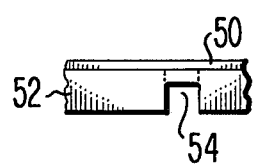
Figure 5:
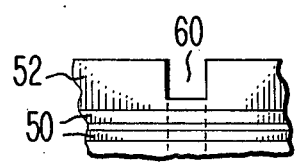

FIG. 1 is a plan view of a printed circuit substrate for use in a television circuit embodying the present invention, FIG. 2 shows the detail of the interconnection of modules 1 and 2 of the substrate of FIG. 1 and some of the printed circuit conductor paths, FIG. 3 is a plan view of a female connector for interconnecting sections 1 and 2 of FIG. 2 after separation at the notches, FIG. 4 is a sectional side and elevational view at the connector of FIG. 3, FIG. 5 is a plan view of a second embodiment of a substrate incorporating the present invention, and FIG. 6 is an end elevational view of the embodiment of FIG. 5.

In FIG. 1 the printed circuit board assembly 10 is illustrated, by way of example, as a television receiver circuit; however, it is to be understood that the invention is equally applicable to other circuits or systems. Circuit board 10 has five sections, merely IF (1), luminance (2), audio (3), chroma (4), and deflection (5). The detailed circuitry of the various sections is not part of the present invention. Each section comprises a module and the dashed lines 12, 14, 16 and 18 indicate schematically the boundaries among the various modules.

It is desirable in the interest of cost and circuit reliability, to manufacture sections 1-5 on a single printed circuit board. However, when made in this way, failure of one or more components in any one or more of the sections, while the system is in use, causes a serious maintenance problem. It is extremely difficult to remove, repair or replace electronic compomnents without damaging the circuit board. Such damage can be very expensive to repair and, in some cases, may not be repairable, as a practical matter.

In a system embodying the present invention, the circuit board assembly 10 has the printed circuit board substrate weakened mechanically by notches along the dashed lines 12, 14, 16 and 18. The manner of interconnection of section 1 to section 2 at the notched boundary between these sections is shown in FIG. 2. The interconnections between other sections are similar and therefore not separately illustrated.

In FIG. 2 substrate 20 which is common to all sections is formed with a plurality of aligned rectangular notches 22. Each notch 22 extends completely through the substrate 20 and is separated from the next notch by a bridge area 24.

The printed circuit conductors 26, 28 and 30, which are located on the upper surface of substrate 20, may be made of copper foil 1 mil. thick. Such conductors may be fabricated in a conventional manner either by the additive or subtractive technique or any other suitable process. Conductor 26, for example, in section 2, is continuous across the entire substrate 20 and extends into section 1 over bridge 24'. In a similar manner the conductors 28 and 30 extend over their corresponding bridges 24 into section 1 to form a continuous electrically conductive path. While three conductors 21, 28 and 30 are illustrated, it is to be understood that in practice these could be any number of conductors in accordance with a given circuit requirement.

In those areas of the substrate where there is no need for conductors, an elongated notch 32 is formed in line with notches 22. The length of notch 32 is determined in accordance with the thickness of the substrate and the size of the sections 1, 2 and 3 and the position of the conductors 26 and 28, 30 and others (not shown). That is, the notch 32 dimensions and position are determined by the strength of the substrate remaining so that the substrate will not fail prematurely.

In a similar manner each of the sections 2, 3, 4 and 5 are interconnected by notches similar to the notches 22 (and 32 where applicable) and electrically connected by conductors such as conductors 26, 28, and 30. As seen in FIG. 2, the bridge areas 24' for each conductor are preferably offset a distance d from the remainder of the conductor path. The reason for this will be explained later.

In use, the circuit board assembly 10 is installed in the conventional manner, for example, in a television receiver. The circuit board is interconnected with other circuits as usual. Upon failure of a component, for example, a component on the IF section 1, the IF section is separated, as a module, from the remainder of the assembly 10. The separation is achieved by manually stressing the assembly at the dashed line 12 and fracturing and separating section 1 from sections 2 and 3 at dashed line 12. The conductors 26, 28 and 30, being relatively thin and brittle material, fracture easily in the area of the notches 22. The fracture is easily accomplished by placing the foils in tension during the fracture.

Upon separation of section 1 from section 2 and 3, a second section (not shown) identical to section 1 in components and placement of the conductors is then attached electrically and mechanically to sections 2 and 3 of the assembly 10 by a suitable connector, an example of which is illustrated in FIGS. 3 and 4.

The connector 34 of FIGS. 3 and 4 is not drawn to the same scale as FIG. 1. In practice, the spacing w between recesses 46 and 48 is equal to or somewhat smaller than the width X of a notch so that when the connector is in place in the manner explained below, a set of contacts 38, 40 engages at one end a conductor (or conductors) on a replacement section such as 1 and this set engages at its other end a conductor or conductors on a good section such as 2. The connector 34 comprises thermoplastic body 36 in which is imbedded a plurality of such contacts 38 and 40, those in recess 46 being of the same shape as those in recess 48. A typical contact such as 38 is formed of a strip of suitable electrical spring metal such as beryllium having a bight 42 at the one end and a bight 44 of like construction at the other end. The bights 42 and 44 are disposed in channel recesses 46 and 48, respectively, on opposite sides of the housing 36. Contact 40 has bights similar to and facing bights 42 and 44. The contacts 38 and 40 form a connection for connecting printed circuit conductors on opposite sides of the substrate 20. Where the printed circuit conductors are formed on only one side of the substrate 20 then only one of the contacts 38 and 40 need be provided, it being understood in any case that the substrates fit into the recesses 46 and 48 under spring bias pressures.

Assuming the substrate 20 has a set of conductors 26 on diametrically opposite surfaces of substrate 20 then the contact 38 electrically would connect with the conductor 26 on one surface and contact 40 with the conductor 26 on the opposite surface. The section 1 that replaces the section 1 that has failed is inserted into one of the recesses 46 or 48 of the connector 34. The contacts 38 and 40 are aligned with and connect with the conductors 26. The remaining conductors 28, 30 and so forth are also connected by corresponding contacts 38 and 40 as necessary. Substrate 20 at sections 2 and 3 is inserted into recess 46 of connector 34 and the contacts 38 and 40 make electrical contact with the corresponding conductors in sections 2 and 3. Thus, substrate 20 is mechanically and electrically interconnected with the replacement section 1.

In a similar manner each of the sections 1–5 may be replaced independently of the other sections by suitable connectors having a construction similar to that of connector 34. Thus, while as initially installed the printed circuit board assembly 10 is, in fact, a single board, modular construction is provided in the case of a subsequent failed component in any portion of assembly 10.

Due to normal fracturing of the circuit board at bridge areas 24, 24′, the edges at these fractured locations may be rough and ragged. Such ragged edges especially on the conductors 26, 28, 30 and so forth tend to interfere with the proper electrical contact of contacts 38 and 40 of connector 34. As the connector 34 is mounted to the sections of interest, the contacts 38 and 40 slide over the edges of conductors 26 etc. The induced roughness at these edges thus may degrade the electrical integrity of the connection. To avoid this, the roughened areas at the bridge areas 24, 24′ being offset distance d, are displaced from the positions of contacts 38 and 40. Thus, contacts 38 and 40 may slide over "clean" edges at the notches 22 and engage the conductors 26, 28, 30 etc. at the notch 22 edges which are not ragged. This structure enhances the electrical integrity of the connection.

An alternate construction is illustrated in FIGS. 5 and 6 wherein conductors 50 are formed on one surface of the substrate 52 and a notch 54 is formed on the opposite surface of the substrate 52. The notch 54 is continuous and elongated extending the length or width of substrate 52. Conductors 50 are above notch 54 on the opposite side of substrate 52. On those portions of the substrate on which there are no conductors 50 then a slot 60 is formed in the substrate which extends completely through the substrate similar to notches 22 of FIG. 2.

Where some portions of the substrate 52 have conductors 50 on both sides then those portions may be notched similar to the manner illustrated in FIG. 2. A circuit board assembly may be formed with a combination of notches both completely through the substrate and partially through the substrate as illustrated respectively by notches 22 and 54.

It will be equally apparent that other types of notches may be formed in a substrate to permit ease of separation of the various sections. Such notches may include drilling circular holes or forming v-shaped grooves or other similar reductions in cross-sections of the substrate at the dashed lines 12, 14, 16 and 18. Regardless of the form of the notches, their purpose is to permit fracturing of the substrate along the line of the notches. Thus, the term notch as used herein includes both a partial removal of the substrate as well as a complete through hole in the substrate. This term also is intended to include a groove which forms an elongated slot or any other structure which weakens a substrate along a predetermined path.

Connectors of different form than the connector 34 may of course be used. For example, mechanical supports may be used to mount the replacement section 1 to a suitable chassis and jumper wires used to interconnect the conductors of the different sections. Also, connectors may be used formed of electrically conductive members on insulating substrates which are mechanically mounted between the sections, e.g., sections 1 and 2, with the members being in electrical contact with the foils of the sections to be interconnected.

There has thus been described a modular printed circuit board assembly construction where the printed circuit board comprises a single printed circuit board assembly without mechanical and electrical connectors connecting the modules thereof. Once a failure occurs, various sections including the failed component may be separated from the remainder of the printed circuit board and replaced with a like section by suitable electrical-mechanical connectors. Thus, the reliability of the printed circuit board is enhanced and the cost reduced by the elimination of the use of the connectors at the original implementation of the assembly in its intended configuration.

What is claimed is:
1. A printed circuit board comprising:
an electrically insulating printed circuit substrate,
at least on electrically conductive path on at least one side of said substrate,
at least one notch formed in said substrate for weakening said substrate along a continuous path dividing said substrate into at least first and second sections, said notch being formed such that said first and second sections can be separated by fracturing the substrate at said notch, said one conductive path passing from said first to said second section on said substrate whereby said fracturing separates said conductive path having a portion on each said section,
a first set of circuit elements on said first section for performing a first electrical function, and a second set of circuit elements on said second section for performing a second electrical function, said first and second set of elements being electrically and operatively interconnected by said at least one electrically conductive path to form an electrical system in which the elements interact with one another in the performance of their functions.

2. A printed circuit board comprising:

an electrically insulating substrate, a plurality of electrical conductors on at least one side of said substrate, a plurality of spaced serially alinged notches formed in said substrate for weakening said substrate along a continuous path dividing said substrate into at least first and second sections, said notches being sized and spaced such that said sections can be separated by fracturing the substrate along said path formed by said notches, said conductors extending from one section to the other section on the substrate intermediate said notches, a first set of elements on said first section for performing a first electrical function, and a second set of elements on said second section for performing a second electrical function, said first and second set of elements being electrically and operatively interconnected by said conductors to form an electrical system in which the elements interact with one another in the performance of their functions.

3. The circuit board of claim 2 wherein said notches are formed of different lengths along said path.

4. The circuit board of claim 2 wherein said notches are formed with different depths.

5. A modular construction comprising:

a printed circuit board for performing an overall system function comprising a substrate subdivided into a plurality of sections, each such section containing the circuit elements of a circuit module, each module performing one part of said overall system function, the boundary of each section comprising a mechanically weakened region of the substrate which, in response to mechanical pressure on a section, fractures and permits removal of that section, the modules being joined to one another by printed conductors on at least one surface of the substrate and the modules interacting with one another via said conductors to together perform said overall electrical function for which the printed circuit board is designed, the conductors passing over the weakened regions of the substrate and being formed of a material which fractures when the weakened section over which the conductors pass is fractured, whereby when one of the modules becomes defective, it may be removed by fracturing the weakened region of the substrate at the boundary of that module, and a replacement module substituted for the weakened module by placing it in the position formerly occupied by the defective module, and connecting conductors of the replacement module to corresponding fractured conductors on the substrate regions adjacent to the position occupied by the replacement module.

6. The construction of claim 5 wherein said weakened region includes a notch in said substrate and said conductors pass over said notch.

7. The construction of claim 5 wherein said weakened region includes a plurality of aligned notches, said conductors passing over the substrate between said notches.

8. A method of constructing and operating a printed circuit board designed to perform an overall function and which includes modules, any one of which can fail, in which any failed module easily can be replaced with a substitute module comprising the steps of:

providing an electrically insulating printed circuit substrate formed with a plurality of conductors on at least one surface of said substrate, forming in the substrate mechanically weakened paths which subdivide the substrate into a plurality of sections, each such section being adapted to operate as a module when circuit elements are in place in said section, each module performing one part of said overall function, the sections being electrically connected to one another by said conductors which pass over said mechanically weakened paths, and when, in operation, one of said modules fails, removing the section containing that module by fracturing the weakened paths in the substrate at the boundary of that section, and substituting a section containing a replacement module for the weakened module by placing it in the position formerly occupied by the section containing the failed module, and connecting the conductors of the section containing the replacement module to corresponding fractured conductors in the substrate regions adjacent to the replacement module.

* * * * *